US012782804B2

(12) United States Patent
Rebstock et al.

(10) Patent No.: US 12,782,804 B2
(45) Date of Patent: Nov. 3, 2026

(54) STOCKER POD, METHOD AND STOCKER FOR STORING A SEMICONDUCTOR FABRICATION ARTICLE

(71) Applicant: BROOKS AUTOMATION (GERMANY) GMBH, Steißlingen (DE)

(72) Inventors: Lutz Rebstock, Gaienhofen (DE); Michael Alexander Schwetz, Winterthur (CH)

(73) Assignee: BROOKS AUTOMATION (GERMANY) GMBH (DE)

(*) Notice: Subject to any disclaimer, the term of this patent is extended or adjusted under 35 U.S.C. 154(b) by 0 days.

(21) Appl. No.: 18/854,839

(22) PCT Filed: Apr. 6, 2023

(86) PCT No.: PCT/EP2023/059285

§ 371 (c)(1),
(2) Date: Oct. 7, 2024

(87) PCT Pub. No.: WO2023/194590

PCT Pub. Date: Oct. 12, 2023

(65) Prior Publication Data

US 2025/0306452 A1 Oct. 2, 2025

(30) Foreign Application Priority Data

Apr. 8, 2022 (EP) .................................... 22167428

(51) Int. Cl.

| | |
|---|---|
| ***G03F 1/66*** | (2012.01) |
| ***G03F 7/00*** | (2006.01) |
| ***H10P 72/10*** | (2026.01) |

(52) U.S. Cl.
CPC ............ *G03F 1/66* (2013.01); *G03F 7/70741* (2013.01); *H10P 72/1906* (2026.01); *H10P 72/1914* (2026.01)

(58) Field of Classification Search
CPC . G03F 1/66; G03F 7/70741; H01L 21/67359; H01L 21/67373; H01P 72/1914; H01P 72/1906
USPC .................................................. 206/710, 453
See application file for complete search history.

(56) References Cited

U.S. PATENT DOCUMENTS

| | | | | |
|---|---|---|---|---|
| 5,314,608 | A * | 5/1994 | Caballero | H01S 3/08068 205/255 |
| 9,761,470 | B2 * | 9/2017 | Abe | H01L 21/67373 |
| 11,237,477 | B2 * | 2/2022 | Hsu | G03F 7/70983 |
| 12,271,110 | B2 * | 4/2025 | Raschke | H01L 21/67393 |

(Continued)

FOREIGN PATENT DOCUMENTS

| | | |
|---|---|---|
| EP | 0522865 | 1/1993 |
| EP | 2432009 | 3/2012 |

OTHER PUBLICATIONS

International Search Report for Application No. PCT/EP2023/059285 dated Jun. 12, 2023.

*Primary Examiner* — Steven A. Reynolds
(74) *Attorney, Agent, or Firm* — Perman & Green, LLP

(57) ABSTRACT

Stocker pod for storing a semiconductor fabrication article, the stocker pod including at least two components with at least one fixator, integrally formed with at least one of the at least two components of the stocker pod, the fixator being configured to immobilize the two or more components of the stocker pod relative to one another.

14 Claims, 4 Drawing Sheets

(56) References Cited

U.S. PATENT DOCUMENTS

| | | | | |
|---|---|---|---|---|
| 2006/0087639 | A1* | 4/2006 | Puerto | B82Y 10/00 355/75 |
| 2006/0260978 | A1 | 11/2006 | Gregerson et al. | |
| 2010/0025277 | A1 | 2/2010 | Iwaki et al. | |
| 2014/0183076 | A1 | 7/2014 | Kolbow et al. | |
| 2017/0372931 | A1* | 12/2017 | Kirkland | H01L 21/673 |
| 2019/0214287 | A1 | 7/2019 | Chiu et al. | |
| 2020/0335371 | A1* | 10/2020 | Chuang | H01L 21/67376 |
| 2021/0116821 | A1* | 4/2021 | Chuang | H01L 21/67359 |

* cited by examiner

STOCKER POD, METHOD AND STOCKER FOR STORING A SEMICONDUCTOR FABRICATION ARTICLE

CROSS-REFERENCE TO RELATED APPLICATIONS

This application is a National Stage of International Application No. PCT/EP2023/059285 having an International Filing Date of 6 Apr. 2023, which designated the United States of America, and which International Application was published under PCT Article 21(2) as WO Publication No. WO2023/194590, which claims priority from and the benefit of European Patent Application No. 22167428.6, filed on 8 Apr. 2022, the disclosures of which are incorporated herein by reference in their entireties.

BACKGROUND

1. Field

The disclosure relates to devices methods and apparatuses for storing semiconductor fabrication articles.

2. Brief Description of Related Developments

Photolithography processes are widely used as one of the key steps in the manufacture of integrated circuits (ICs) and other semiconductor-related devices and/or structures. However, as the dimensions of features produced by such processes decrease, the importance of photolithography for the production of miniature ICs or other devices and/or structures rises.

In photolithography, a geometric pattern is transferred from a photomask (typically referred to as reticle) onto a substrate, for example a semiconductor wafer, by the use of light, a photosensitive layer and a subsequent etching step. Depending on the desired feature size on the substrate, the feature size of the reticle needs to be adapted as well as the wavelength of the light used for pattern transfer, with consideration of the Raleigh criterion.

In order to reduce the smallest achievable feature size, it has been proposed to use extreme ultraviolet (EUV) radiation. EUV radiation is electromagnetic radiation having a wavelength within the range of 5-20 nm, for example within the range of 5-10 nm.

Any contamination of the reticle may reduce the imaging performance of the photolithographic process and may in more serious cases require the reticle to be replaced. The reticle is typically expensive and therefore any reduction in the frequency with which it must be replaced is advantageous. Furthermore, replacement of the reticle is a time consuming process, during which the photolithographic process may have to be suspended, thereby reducing its efficiency, which is undesirable.

For EUV applications, particle contamination with particle sizes of less than 10 nm as well as chemical contamination, for example by adsorption of volatile organic compounds, can be relevant.

The reticles used for such EUV applications are therefore typically stored in a storage stocker, and retrieved when needed in connection with the lithography exposure equipment. Usually, the reticles are contained in a double shell container (double pod) comprising a so-called EUV outer pod (EOP) and an EUV inner pod (EIP).

Such a double pod is described in further detail in US 2019/0214287 A1, for example.

Since the acceptable level of particle contamination is extremely small, friction (which leads to abrasion and thus particle generation) of the reticle against the container as well as friction of container components relative to one another needs to be avoided. Therefore, typical EIPs are designed so as to accommodate one reticle in such a way that it has only very limited possibilities to move therein. They are also equipped with additional reticle immobilization means to immobilize the reticle inside the EIP. In order to prevent contamination, the EIP is designed to enable a protective gas or vacuum to be applied to the reticle. To that end, typically orifices equipped with filter material are provided for the protective gas to enter from the EOP into the surroundings of the reticle contained in the respective EIP.

The EOP is equipped with actuation means adapted to bias the reticle immobilization means of the EIP into a retaining position, thereby immobilizing the reticle inside the EIP when the EOP is attached to the EIP. The EOP also functions to immobilize the typically two pieces of the EIP against one another to prevent friction induced abrasion.

It is to be understood that the EIP components are moveable against one another as long as they are not immobilized from outside. In order to avoid friction induced abrasion caused by such movement, the EOP conventionally provides such immobilization functionality for the EIP while also providing protection against the surrounding atmosphere, which is necessary e.g. during transport between a storing position and process tools requiring reticles for operation.

EOPs are rather bulky, leading to high space requirements or "footprint" for stockers storing EUV reticles. Furthermore, they are made of polymeric material, which is also prone to abrasion and outgassing of volatile organic compounds.

SUMMARY

The present disclosure attempts to solve these problems by providing methods, devices and apparatuses with features according to the independent claims. Advantageous aspects and additional features are provided in the dependent claims and discussed in the following description.

The present disclosure enables reducing the required space for storing reticles while ensuring at least the same level of contamination and damage protection provided by conventional systems. Chemical contamination during storage from outgassing EOPs is prevented and mechanical damage protection improved over storing reticles in double pods. For example, EOPs can easily be damaged during an earthquake, while devices according to the present disclosure are less fragile, even under such challenging conditions, as will be understood from the following description.

Aspects which need to be taken into account when developing such an improved storage concept include that it is highly undesirable to change the way the reticles are provided to the photolithographic process equipment, this typically being the most complicated and costly part of a semiconductor production facility.

Therefore, since the photolithographic process equipment is typically adapted to receive double pods, means for providing a conventional double pod to the photolithographic process equipment are advantageously provided with the improved reticle stocker.

In one aspect, the disclosure provides a stocker pod for storing a semiconductor fabrication article comprising at least two components with at least one fixator, integrally formed with at least one of the at least two components of the stocker pod, the fixator being configured to immobilize the two or more components of the stocker pod relative to one another. The semiconductor fabrication article may particularly be one out of the group consisting of a wafer, a part of a wafer and a reticle, particularly an EUV reticle.

By providing specific stocker pods, the contamination level within a respective stocker may be greatly decreased in comparison to traditional storing methods in which the articles are stored within pods which are also used outside the stocker. The stocker pods, during normal operation, do not have to leave the stocker and, therefore, cannot transport contaminants from outside the stocker into the stocker. It is, however, important to provide a comparable protection for the article during storage as is the case with the mentioned traditional storage conditions. The fixators immobilizing the stocker pod components relative to one another keep the protective shell of the stocker pod around the article even in such events like, for example, earthquakes or even simple power outages so that the article is not damaged in such situations.

The at least one fixator is preferably biased towards a closed position and is configured to be moved into an open position, wherein the at least two components are configured to be attachable to one another to form the stocker pod when the at least one fixator is in the open position, and wherein the at least one fixator is configured to immobilize the at least two components relative to one another, when it is in the closed position. This aids towards the aim of protection in situations, in which no fixation from outside may be provided, such as the mentioned power outages or potentially necessary evacuation scenarios.

The at least one fixator is preferably configured to be locked in the open position such as to overcome the bias towards the closed position. This is advantageous, for example, in order to use existing equipment in relation to the proposed stocker pods, which is not configured to open the fixator. Examples of such equipment may include cleaning tools, which may be adapted for cleaning inner pods of the double pods mentioned earlier, which in such advantageous configurations may also be used to clean the stocker pod.

The at least one fixator is advantageously provided in the form of a latch on one of the at least two components and an engagement member engageable with the latch provided on another one of the at least two components. This is a particularly robust option for providing the fixator. For example, the engagement member may be slidable along a side of the component on which it is provided or pivotable (for example when hingedly attached to the component) or slideable in a direction perpendicular to the side of the component on which it is provided. The bias towards the closed position may be effected by a spring element, a magnet or the like.

The at least two components preferably form a gap between one another when immobilized relative to one another. This aids purging the surrounding of the article, thereby additionally increasing the level of cleanliness and contamination protection. This is somewhat counter intuitive, since normally sealing against the surrounding atmosphere is considered essential for contamination protection. However, since the stocker pod of this disclosure is only used inside the stocker during normal operation, increased purging efficiency provides a larger cleanliness advantage than preventing the stocker atmosphere from flowing around the article.

Particularly, the gap extends over a portion of at least one side surface of the stocker pod comprising an area in the range of 2% to 50%, particularly 5% to 30%, preferably 10% to 25%, of an area of the at least one side surface of the stocker pod. This provides for a largely undisturbed flow without unduly decreasing the stability of the stocker pod as a whole.

The gap preferably spans a lateral portion of at least one side surface of the stocker pod amounting to between 20% and 90%, particularly between 30% and 85%, preferably between 50% and 80%, of a width of the at least one side surface. The gap may also span up to 100% of the width of the side surface, wherein necessary connections between the components, such as support pins or the like, are neglectable in terms of lateral extension. The gap may span a vertical portion of at least one side surface of the stocker pod amounting to between 5% and 80%, particularly between 15% and 70%, preferably between 20% and 50%, of a height of the at least one side surface. This provides an opening with a favourable geometry in terms of flow mechanics.

In advantageous aspects, the stocker pod has a height in the range of 10 to 30 mm, such that the gap may have a height in the range of 0.5 mm to 24 mm, particularly 1.5 mm to 21 mm, preferably 2 mm to 15 mm. This enables largely undisturbed flow of purge gas into and/or out of the stocker pod. Disturbances are undesired as they may prevent efficient transport of contaminants away from the article.

In some advantageous aspects, a tortuous path is formed between the at least two components of the stocker pod in at least one portion of at least one side surface in which portion the gap mentioned above is not formed. This provides the advantage of hindering particles from entering the inner volume while still allowing purge gas to exit via the tortuous path through the respective side surface of the stocker pod.

The stocker pod advantageously comprises at least 75%, 80%, 90%, 95% or 99% and up to 100% of metallic materials with respect to its mass and/or volume. This prevents chemical contamination of the article, for example through outgassing of polymeric materials.

Advantageously, the stocker pod further comprises a retainer configured to immobilize the article within the stocker pod, at least when the fixator is in the closed position. Thereby, abrasion induced particle generation may be prevented during external motion events, such as an earthquake, as well as during internal motion events, for example moving a stocker pod into or out of a respective storage position.

In another aspect, the disclosure provides a method of storing a semiconductor fabrication article comprising enclosing the article in a stocker pod as just described and storing the stocker pod within a storage position within a reticle stocker. This method profits from the just described advantages of the stocker pod in a corresponding manner.

Advantageously, the method further comprises receiving an EUV double pod comprising an EUV inner pod and an EUV outer pod and containing the article, opening the outer pod and the inner pod, recovering the article from the inner pod and arranging the stocker pod around the article retrieved from the inner pod. This has the advantage that existing routines within a semiconductor production facility may be used without any adaptation with the corresponding effects on investment costs.

Particularly, the method comprises moving the fixator into the open position, opening the stocker pod, placing the article into the stocker pod, closing the stocker pod and releasing the fixator. Thereby, the fixator, being biased into the closed position will move into the closed position upon being released. Be it noted, that the fixator need not be locked in the open position in order to be released, it may simply be held in the open position by a handler, for example. This corresponds to the specified operation of the stocker pod described above.

Another aspect of the disclosure provides a stocker for storing a semiconductor fabrication article, particularly an EUV reticle, configured to perform a method as just described and to hold a number of stocker pods within storage positions in the stocker. The stocker profits from the same advantages as the stocker pod, mutatis mutandis.

BRIEF DESCRIPTION OF THE DRAWINGS

In the description of the drawings, like elements are referred to with identical reference numerals. Their respective description is not repeated for every figure for reasons of conciseness.

DETAILED DESCRIPTION

Figure 1:
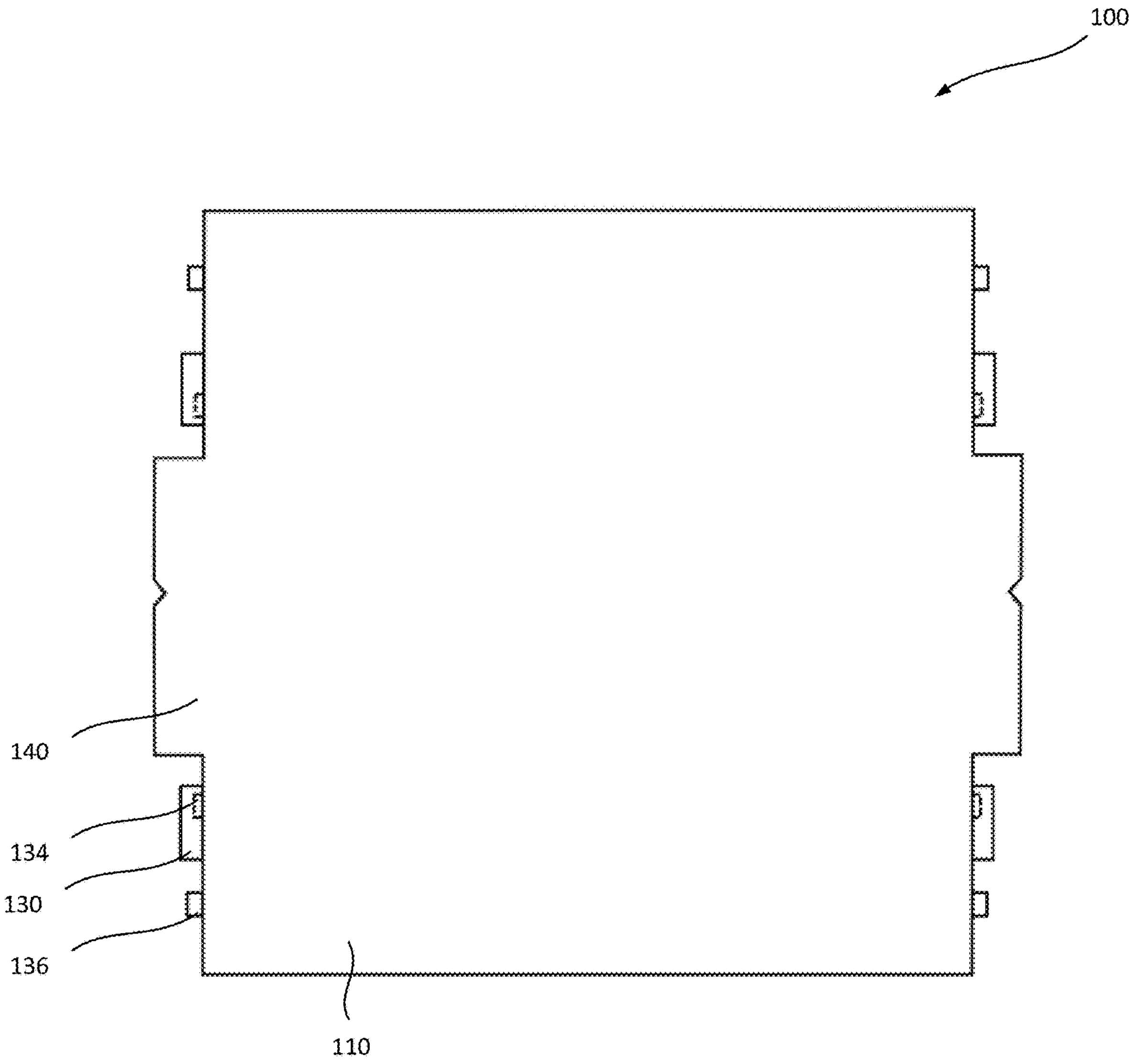
FIG. 1 schematically depicts an advantageous aspect of a stocker pod according to the disclosure in a top plan view.
Figure 2:
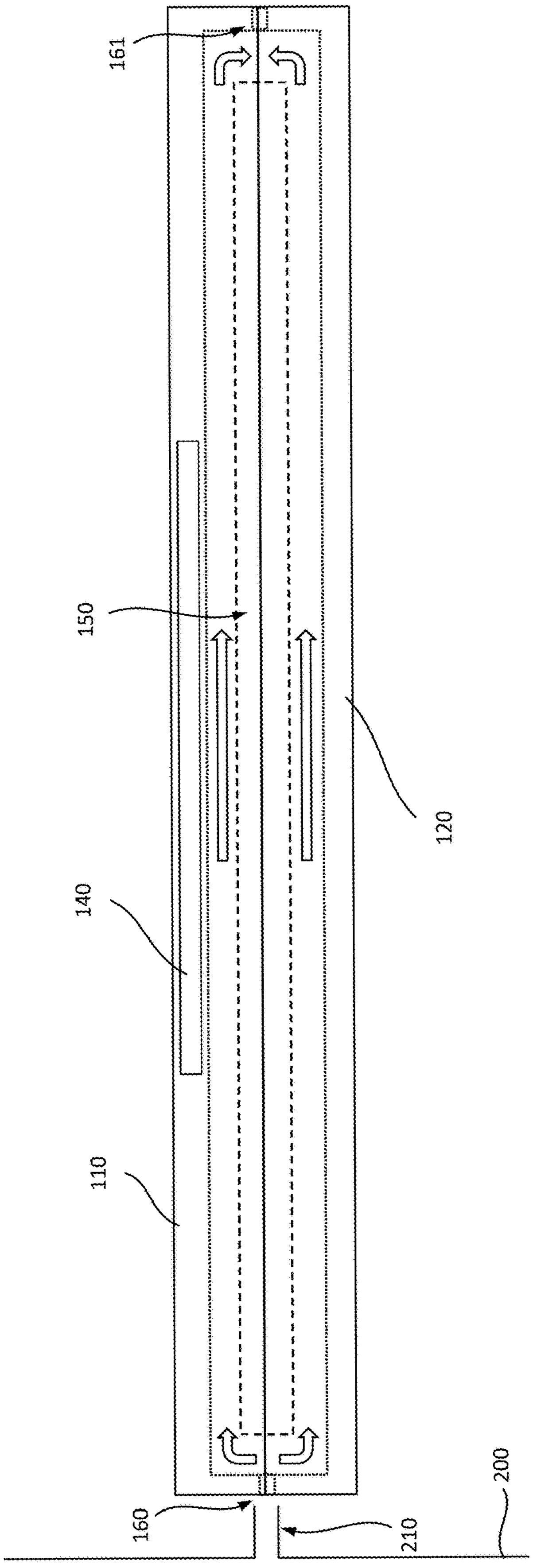
FIG. 2 schematically depicts an advantageous aspect of a stocker pod according to the disclosure in use in a side plan view.

In FIG. 1, an advantageous aspect of a stocker pod according to the disclosure is schematically depicted in a top plan view and generally referred to by reference numeral 100. FIG. 2 shows the same aspect in use in a schematic side plan view. In the figures in which substantially symmetric configurations are depicted, not all of the identical elements are labelled with a reference numeral in order to enable an unobstructed visibility of the depicted features.

The stocker pod 100 in the aspect shown comprises an upper component (cover) 110 and a lower component (base) 120 (which is covered by the upper component and, therefore, not visible in FIG. 1).

The upper component 110 comprises a handling extension 140 which extends laterally from the stocker pod 100 and is configured to be handled by a handler, for example an end effector of a robot operating within a reticle stocker to store reticles in respective storage positions and to retrieve them from the respective storage positions.

Figure 3:
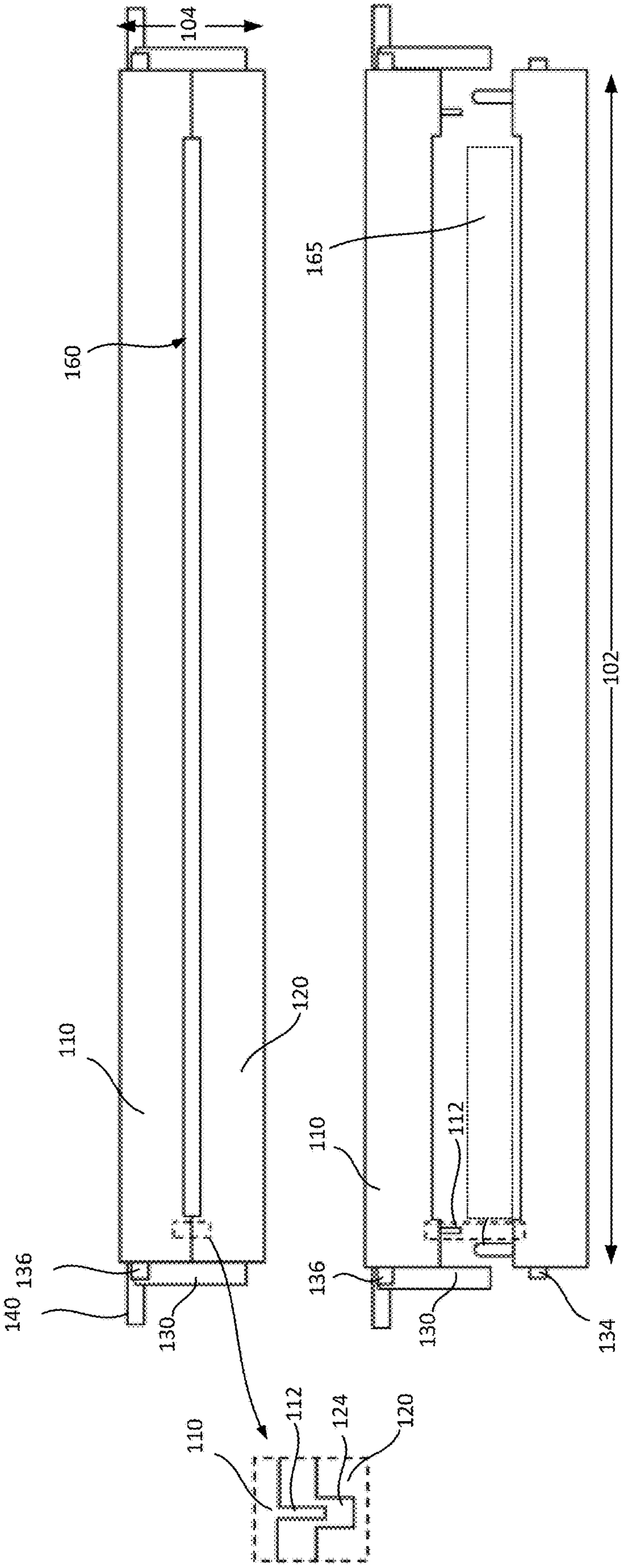
FIG. 3 schematically depicts the assembly and/or disassembly of the aspect of FIG. 2 in a front plan view.

The stocker pod 100 further comprises fixators 130 for immobilizing the upper 110 and lower 120 components of the stocker pod 100 relative to one another. In the example shown, four fixators 130 are provided in the form of latches, which are each slideable along a respective side of the stocker pod 100. Each latch engages with an engagement member 134 provided on the lower component, as can be seen in FIG. 3. Alternatively, a latch provided on lower component 120 may engage with an engagement member 134 provided on upper component 110. It is to be understood that the number of latches or fixators in general is not limited to the exact value of four, but more or fewer fixators may be provided.

In FIG. 2, the stocker pod 100 is shown in use in a storage position within a stocker. A purge gas, e.g. dry air, synthetic air, nitrogen, argon or any other suitable gas, is provided via a back wall 200 of the storage position through an outlet 210. The upper and lower components 110, 120 form a gap 160 between one another, through which the purge gas enters the stocker pod 100 to purge an internal volume of the stocker pod 100, which is indicated by dotted lines. Within the inner volume, a semiconductor fabrication article, for example an EUV reticle 150 is contained. The purge gas flows around the reticle 150, as indicated by bold arrows. The purge gas may exit the stocker pod through a gap 161 on the side opposite the side facing the back wall 200 of the storage position. This configuration provides a substantially uniform flow of purge gas over the entire reticle 150.

The gap 160, 161 at either end can be open, or contain a filter, and/or have an obstruction 165 to influence purge gas flow. For example, the space could contain an obstruction 165 in the form of one or more plates having slots or perforations. Such plate(s) can be attached to the top and/or bottom component such that when the components are fitted together and a purge gas is applied, the gas is made to flow through the plate. Slots or holes in the plate can be arranged to produce a desired purge gas flow regime and/or rate.

In FIG. 3, the assembly and further details of a stocker pod 100 are illustrated. The upper component 110 with the latch 130 is moved in a vertical direction towards the lower component 120 in order to close the stocker pod 100. One or more guide pins 122, here provided on the lower component 120, (and corresponding guide pin accepting openings on the opposite component 110) aid the correct alignment of the two components 110, 120. Each of the components 110, 120 exhibits a recess in the front and back side walls, such that when the two components 110, 120 are attached to one another, a gap 160 is formed in either of the front and back side walls. This forms the flow path for the purge gas discussed in relation with FIG. 2 above. On the remaining side walls of the stocker pod 100 (the walls carrying the latches 130), according to the aspect shown in FIG. 3, a tortuous path is formed by a protrusion 112 extending from the upper component 110 towards the lower component 120 along said side walls and a corresponding recess 124 in the lower component 120, as illustrated in the inset of FIG. 3. This tortuous path prevents particles generated by the operation of the latches 130 from entering the inner volume of the stocker pod 100.

The tortuous path 112, 124 mentioned above can extend along most of the length of the side walls or along only one or more portions of the side wall length. In cases, in which it extends only along one or more portion(s), the portion(s) that do(es) not include a tortuous path could be tightly sealed or open (in a manner similar to gap 160, 161). In some aspects, areas near or adjacent to the fixators 130 may be tightly sealed and areas further from the fixators 130 may include the tortuous path. In other aspects, areas near or adjacent to the fixators 130 may include the tortuous path 112, 124 and areas further from the fixators 130 may be open (in a manner similar to gap 160). In still other aspects, the entire length of the side walls is tightly sealed to prevent gases and/or particles from entering the stocker pod 100 from the side walls. The tortuous path 112, 124 and/or tightly sealed portions proximate the fixators 130 prevent particles generated by the operation of the fixators 130 from entering the inner volume of stocker pod 100.

Figure 4:
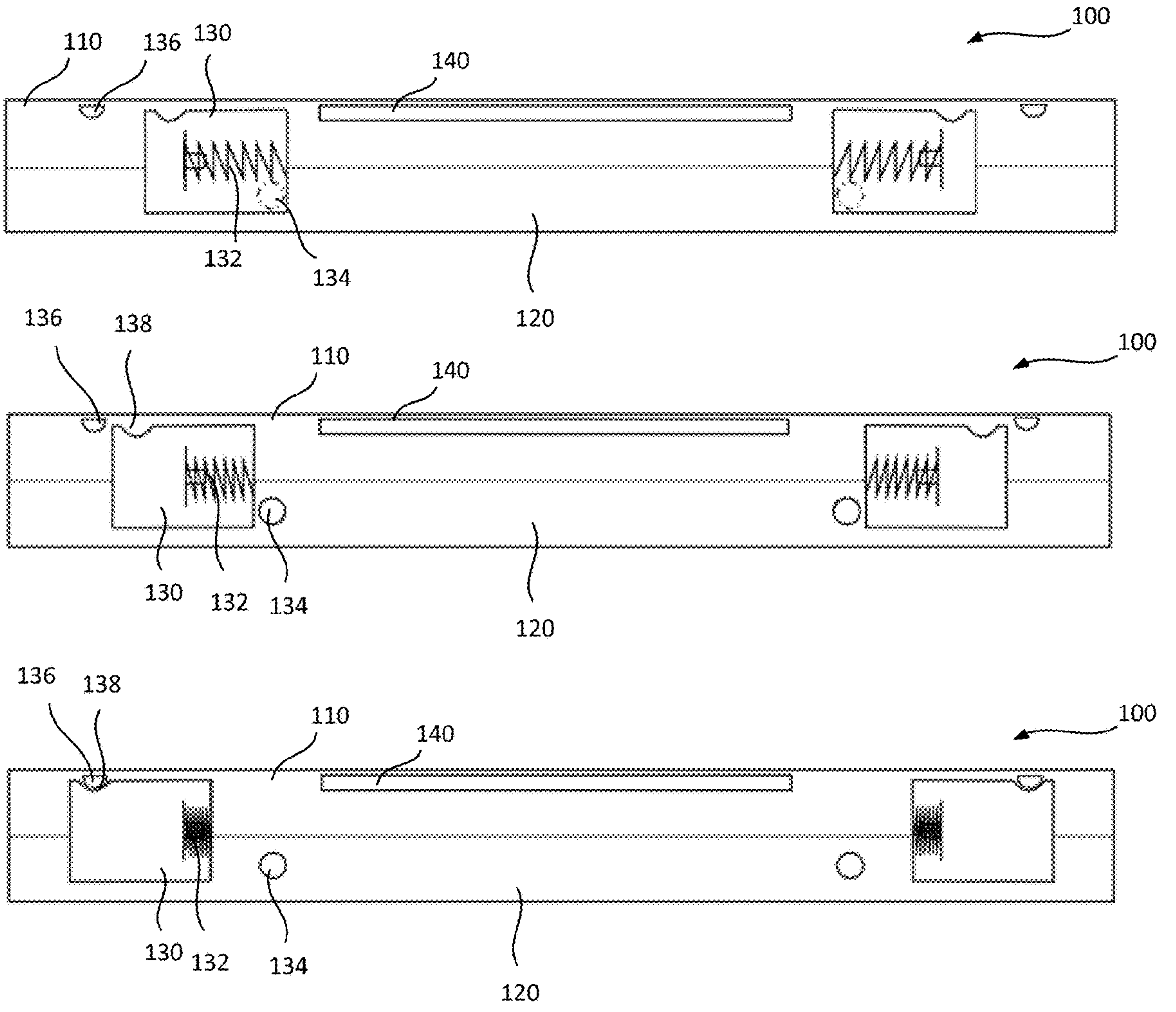
FIG. 4 schematically depicts the operation of a fixator of an aspect of a stocker pod according to the disclosure in a side plan view.

In FIG. 4, the operation of the latches 130 is illustrated in greater detail. Each of the latches 130 is provided with a biasing element 132, for example a spring such as a coil spring 132, biasing the latch into a closed position, which is shown in the topmost illustration in FIG. 4. In the aspect shown in FIG. 4, the latch is provided with the lower component 120 and an engagement element 134 is provided on the opposite (upper) component 110. For opening and closing the stocker pod 100, the latch(es) 130 is/are brought into an open position in which the engagement elements 134 are disengaged with the respective latch 130, as depicted in the central illustration in FIG. 4. In such a situation, the force of the strained coil springs 132 acts in the direction of the closed position. This means that the latches 130 cannot be opened inadvertently, since the latches 130, once closed, stay in the closed position until they are forced into the open position.

The lowermost illustration in FIG. 4 depicts a special situation, in which the latches 130 are locked in the open position, i.e. disengaged from the engagement elements 134. The locking in the open position is effected by a retainer 136 which is engageable, for example, with a recess 138 provided on the latch 130. When engaged with the recess 138 on the latch 130, the retainer 136 holds the latch 130 with a force exceeding the biasing force of the coil spring 132, such that the latch 130 remains in the locked open position. This configuration is advantageous for situations or operations in which the stocker pod 100 needs to be handled with tools, which are unable to open the latch 130 themselves. In preparation for use with such tools, the latches 130 of the stocker pod 100 are brought into the locked open position before providing the stocker pod 100 to the respective tool. For example, cleaning machinery adapted to clean typical inner pods of the EUV double pods mentioned in the outset of this description may also be used for cleaning the stocker pods 100 of this disclosure. However, since typical inner pods are not equipped with such a latch mechanism, the cleaning tool may not be able to handle the latch 130. Therefore, the latch 130 is locked in the open position, so that the handling within the cleaning tool may comprise the same steps as for cleaning the typical inner pod.

What is claimed is:

1. A method for storing a semiconductor fabrication article, the method comprising:

receiving an EUV double pod having an EUV inner pod and an EUV outer pod and containing the semiconductor fabrication article;

opening the outer pod and the inner pod;

recovering the article from the inner pod;

enclosing the article in a stocker pod by arranging the stocker pod around the article retrieved from the inner pod; and storing the stocker pod within a storage position within a semiconductor fabrication stocker;

wherein the stocker pod includes at least two components with at least one fixator, integrally formed with at least one of the at least two components of the stocker pod, the fixator being configured to immobilize the at least tow components of the stocker pod relative to one another, wherein the at least one fixator is biased towards a closed position and is configured to be moved into an open position; wherein the at least two components are configured to be attachable to one another to form the stocker pod when the at least one fixator is in the open position, and wherein the at least one fixator is configured to immobilize the at least two components relative to one another, when it is in the closed position, wherein the at least one component with which the at least one fixator is integrally formed, includes a locking feature configured to be engageable with the at least one fixator in the open position, the at least one fixator is configured to be lockable in the open position, such as to overcome the bias towards the closed position, when it is engaged with the locking feature.

2. The method as claimed in claim 1, wherein the at least one fixator includes a latch on one of the at least two components and an engagement member for engaging with the latch provided on another one of the at least two components.

3. The method as claimed in claim 2, wherein the locking feature is provided on the one component, on which the latch is provided.

4. The method as claimed in claim 1, wherein the at least two components are disposed forming a gap between one another when immobilized relative to one another.

5. The method as claimed in claim 4, wherein the gap is formed extending over a portion of at least one side surface of the stocker pod having an area in the range of 2% to 50% of an area of the at least one side surface of the stocker pod.

6. The method as claimed in claim 4, wherein the gap is formed spanning a lateral portion of at least one side surface of the stocker pod amounting to between 20% and 90% or 100% of a width of the at least one side surface and/or wherein the gap is formed spanning a vertical portion of at least one side surface of the stocker pod amounting to between 5% and 80% of a height of the at least one side surface.

7. The method as claimed in claim 4, wherein the stocker pod has a height in the range of 10 mm to 30 mm, and/or wherein the gap has a height in the range of 0.5 mm to 24 mm.

8. The method as claimed in claim 4, wherein a tortuous path is provided between the at least two components in at least one portion of at least one side surface of the stocker pod, in which portion the gap is not formed.

9. The method as claimed in claim 4, wherein a filter and/or an obstruction for influencing a flow of a purge gas is provided within the gap.

10. The method as claimed in claim 1, wherein the semiconductor fabrication article is one out of the group of a wafer, a part of a wafer, and a reticle.

11. The method as claimed in claim 1, comprising at least 75%, 80%, 90%, 95% or 99% and up to 100% of metallic materials with respect to a mass and/or volume of the stocker pod.

12. The method as claimed in claim 1, wherein a retainer is provided for immobilizing the article within the stocker pod, at least when the fixator is in the closed position.

13. The method as claimed in claim 1, further comprising moving the fixator into the open position, opening the stocker pod, placing the article into the stocker pod, closing the stocker pod and releasing the fixator.

14. A stocker for storing a semiconductor fabrication article configured to perform the method according to claim 1 and to hold a number of stocker pods within storage positions in the semiconductor fabrication stocker.

* * * * *